(12) United States Patent
Horbach et al.

(10) Patent No.: US 7,924,091 B2
(45) Date of Patent: Apr. 12, 2011

(54) CLASS-D TRANSCONDUCTANCE AMPLIFIER

(75) Inventors: Ulrich Horbach, Canyon County, CA (US); Jaye Waas, Manhattan Beach, CA (US)

(73) Assignee: Harman International Industries, Incorporated, Northridge, CA (US)

( * ) Notice: Subject to any disclaimer, the term of this patent is extended or adjusted under 35 U.S.C. 154(b) by 453 days.

(21) Appl. No.: 12/046,338

(22) Filed: Mar. 11, 2008

(65) Prior Publication Data

US 2009/0232332 A1    Sep. 17, 2009

(51) Int. Cl.
*H03F 3/217*    (2006.01)
(52) U.S. Cl. ........................................ 330/251
(58) Field of Classification Search .................. 330/10, 330/207 A, 251
See application file for complete search history.

(56) References Cited

U.S. PATENT DOCUMENTS 7,196,580 B2 * 3/2007 Ryoo et al. .................. 330/251
2005/0162223 A1 * 7/2005 Maejima ....................... 330/10

OTHER PUBLICATIONS

Mills, P.G.L., et al.;Transconductance Power Amplifier Systems for Current-Driven Loudspeakers; J. Audio Eng. Soc.; Oct. 1989; vol. 37, No. 10; pp. 809-822.
Mills, P.G.L., et al.; Distortion Reduction in Moving-Coil Loudspeaker Systems Using Current-Drive Technology; J. Audio Eng. Soc.; Mar. 1989; vol. 37, No. 3; pp. 129-148.
Strydom, Johan, et al.; 120 W x 2 Channel Class D Audio Power Amplifier Using IRS20955 and IRF6645 International Rectifier; Reference Design; pp. 1-42.
Designing Practical High Performance Class D Audio Amplifier; International Rectifier; Class D Audio.

* cited by examiner

*Primary Examiner* — Khanh V Nguyen
(74) *Attorney, Agent, or Firm* — The Eclipse Group LLP (57) ABSTRACT

The invention relates to a class-D audio amplifier. The class-D audio amplifier is configured in a current feedback mode as a voltage-controlled current source and a passive inductor/capacitor (LC) reconstruction filter. A portion of the passive LC reconstruction filter is situated in a feedback loop to an error amplifier.

17 Claims, 12 Drawing Sheets

PRIOR ART

CLASS-D TRANSCONDUCTANCE AMPLIFIER

BACKGROUND OF THE INVENTION

1. Field of the Invention

This invention relates generally to class-D amplifiers. More particularly, the invention relates to class-D transconductance audio amplifiers.

2. Related Art

Conventional class-D amplifiers operate as voltage-controlled voltage sources and are often utilized in audio electronics to drive loudspeakers. Class-D amplifiers are also known as "switched mode" amplifiers because they operate by switching transistors, such as field effect transistors (FETs), at a carrier frequency to create a switched carrier signal. The switched carrier signal is typically a pulse width modulated (PWM) signal in the 300 kilohertz (kHz) to 500 kHz range that varies depending upon the amplitude of the input signal. Audio input signals typically in the range of 20 Hertz (Hz) to 20 kilohertz (kHz) are propagated to the loudspeakers via the switched carrier signal. A feedback path provides feedback to the amplifier input to reduce both distortion and output impedance. Low-pass filtering is used to filter the carrier and reconstruct the propagated audio signal at the load.

Figure 1:
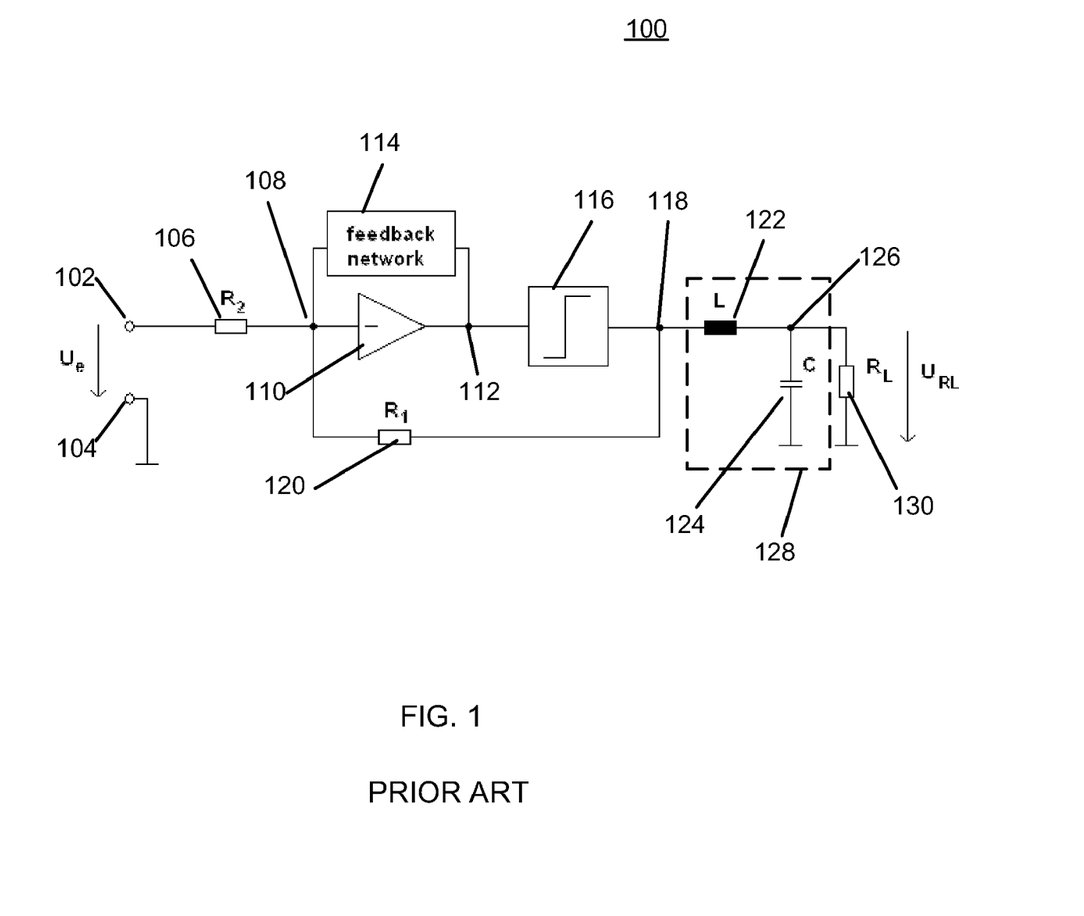
FIG. 1 is a block diagram of a conventional class-D amplifier.

FIG. 1 is a block diagram of a conventional class-D amplifier 100. An audio input signal having a voltage $U_e$ is provided to the amplifier 100 at input terminal 102 relative to a terminal 104 at ground potential. An input resistor $R_2$ 106 is connected between the input terminal 102 and an inverting input node 108 of an operational amplifier 110. The operational amplifier 110 is configured as an integrator with a feedback network 114 and the input resistor 106. Details on suitable components for the feedback network 114 may be found within a technical reference on class-D amplifiers. For purposes of this description, the feedback network 114 may include two capacitors in series in the feedback path with a resistor connected between the interconnection of the series capacitors and ground.

The output of the inverting amplifier 110 at node 112 is connected to a power switch 116 that switches depending upon the sign of the audio signal to drive a positive or negative voltage to a node 118. The power switch 116 includes a gate driver and metal oxide semiconductor FET (MosFET) power transistors (not shown) to provide voltage switching and current supply capabilities. The voltage at node 118 is fed back to the input of the inverting amplifier 110 at node 108 via a feedback resistor $R_1$ 120 that is connected between the two nodes 118 and 108.

By means of suitable choice of the feedback component values of the feedback network 114, the amplifier 100 is forced to self-oscillate at a defined frequency which is typically in the range of 300 kHz to 500 kHz. This high-frequency carrier signal is pulse-width modulated by the audio input signal $U_e$ such that the output spectrum at audio frequencies, typically up to 20 kHz, becomes nearly identical to the input spectrum at node 102. Because the operational amplifier 110 has very high gain in the audio band it suppresses any error or deviation between both spectra.

The binary, switched PWM signal at node 118 is passed to an inductor 122. A capacitor 124 is connected between ground and the inductor 122 at a node 126. Together the inductor 122 and the capacitor 124 form a passive LC reconstruction filter 128. The passive LC reconstruction filter 128 acts as a low-pass filter to remove the high-frequency PWM carrier signal and reconstruct the audio signal as an amplified audio signal capable of driving a loudspeaker represented by a load resistor $R_L$ 130 that is connected between node 126 and ground. The reconstructed amplified audio signal is represented as a voltage $U_{RL}$. As such, the conventional class-D amplifier 100 of FIG. 1 acts as a voltage-controlled voltage source.

As can be seen from FIG. 1, the passive LC reconstruction filter 128 is separated from the feedback path through the feedback resistor $R_1$ 120. This is unavoidable because the LC reconstruction filter 128 induces phase lag if placed within the feedback loop of the amplifier 100. The phase lag occurs because the voltage at node 126 at the output of the inductor 122 is dependent upon the derivative of the current change through the inductor 122. As such, a time delay is imposed upon the voltage changes at the load $R_L$ 130.

There exists a need to provide a voltage-controlled current source-type class-D transconductance amplifier, rather than a voltage-controlled voltage source-type class-D amplifier. This is particularly important for active multiway loudspeaker applications, where a voice coil is directly driven by the amplifier. Since force to the voice coil is directly proportional to current, membrane motion may be controlled more directly, thereby eliminating nonlinear series impedance elements such as voice coil resistance and inductance.

SUMMARY

A class-D transconductance amplifier topology is described having a passive LC reconstruction filter that forms a portion of a feedback loop for the amplified. The class-D transconductance amplifier operates in a current feedback mode as a voltage-controlled current source. The passive LC reconstruction filter does not include a series inductor between a power switch and the load. Accordingly, phase lag is reduced between the power switch and the load and allows a portion of the passive LC reconstruction filter to be included within the feedback loop.

One implementation of a class-D audio amplifier includes a power switch adapted to provide drive current to an audio loudspeaker, where the power switch operates in a current mode as a voltage-controlled current source, and a passive inductor/capacitor (LC) reconstruction filter adapted to situate at least a portion of the passive LC reconstruction filter in a feedback loop to an error amplifier.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 2:
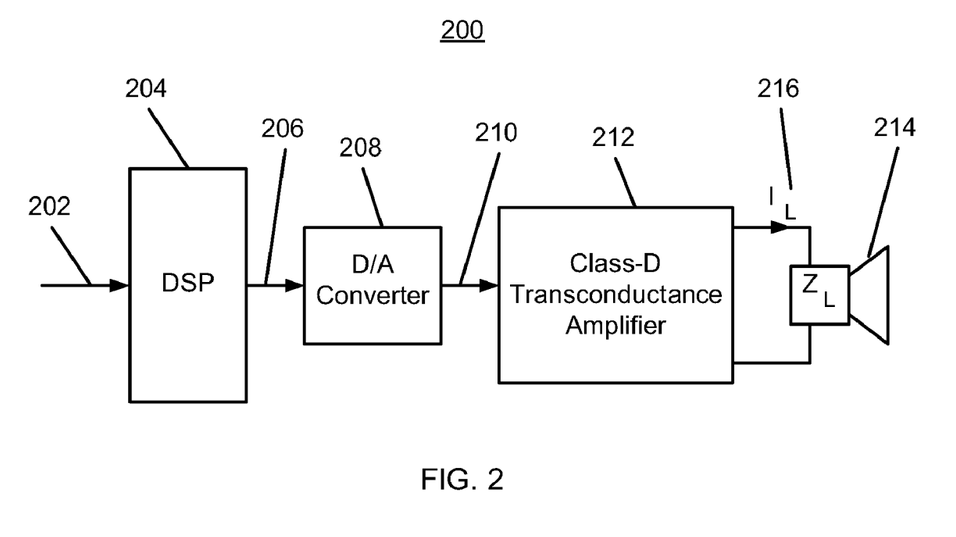
FIG. 2 is a block diagram of an example of one implementation of an audio system according to the invention.

FIG. 2 is a block diagram of an example of one implementation of an audio system 200 according to the invention. A digital audio input signal 202 is received by a digital signal processor (DSP) 204. The DSP 204 implements a variety of signal processing operations, such as a digital crossover filter and related circuitry for audio processing (not shown). For ease of illustration, only one audio channel is represented within FIG. 2. The DSP 204 may, however, output digital audio signals for each audio channel in the audio system 200. The DSP 204 outputs a digital audio signal 206 for one of the audio channels. A digital to analog (D/A) converter 208 converts the digital audio signal 206 to an analog audio signal 210. Because the digital crossover filter is implemented within the DSP 204, a separate class-D transconductance amplifier 212 directly drives each loudspeaker 214 within the audio system 200. Unlike a conventional class-D amplifier, the class-D transconductance amplifier 212 drives the loudspeaker 214 with a current 216 that is proportional to the analog audio input.

Figure 3:
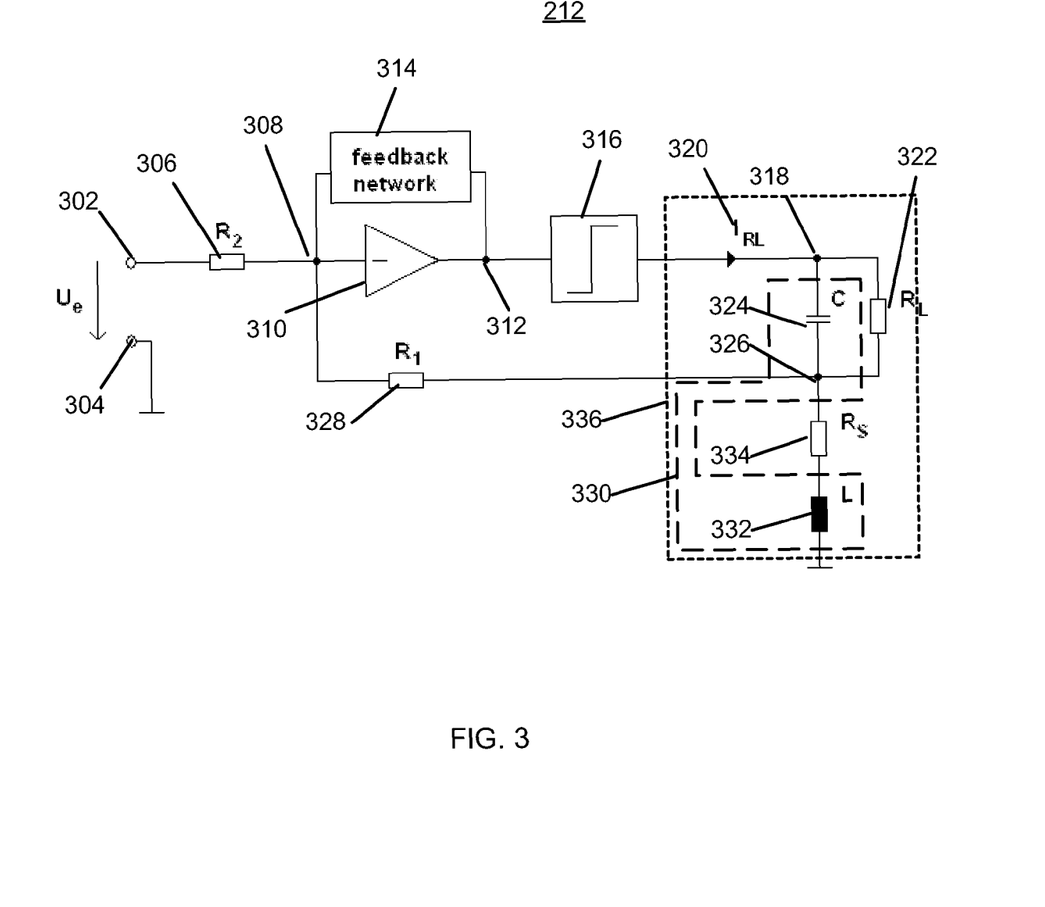
FIG. 3 is a circuit diagram of an example of one implementation of a class-D transconductance amplifier.

FIG. 3 is a circuit diagram of one example of an implementation of a class-D transconductance amplifier 212. An analog audio input signal having a voltage $U_e$ is provided to the amplifier 212 at input terminal 302 relative to a terminal 304 at ground potential. An input resistor $R_2$ 306 is connected between the input terminal 302 and a node 308. Resistor $R_2$ 306 forms a portion of circuitry that defines a transfer function for the amplifier 212. A high-gain operational amplifier 310 receives the audio input signal from node 308 and amplifies the input signal to create an output signal at its output to a node 312. A feedback network 314 is designed such that the amplifier provides infinite gain at low frequencies and acts as an integrator. Details on suitable components for the feedback network 314 may be found within a technical reference on class-D amplifiers and are known by those skilled in the art.

The output of the operational amplifier 310 at node 312 is connected to a power switch 316 that switches depending upon the sign of that signal to drive a positive or negative voltage to a node 318. The power switch 316 includes a gate driver and metal oxide semiconductor FET (MosFET) power transistors (not shown) to provide voltage switching and output current signal $I_{RL}$ 320 to a load resistor RL 322.

A capacitor 324 bypasses the load resistor $R_L$ 322 and is connected in parallel with the load resistor $R_L$ 322 between node 318 and a node 326. The positive or negative voltage generated by the power switch 316 at node 318 is passed to node 326. The voltage at node 326 is fed back to the input of the high-gain error amplifier 310 at node 308 via a feedback resistor $R_1$ 328 that is connected between the two nodes 326 and 308.

The capacitor 324 forms a portion of a passive LC reconstruction filter 330 and provides a first pole to the filter 330. An inductor 332 forms another portion of the passive LC reconstruction filter 330 and provides the other pole for the passive LC reconstruction filter 330. The passive LC reconstruction filter 330 provides a reconstruction filter operation for the output current signal $I_{RL}$ 320. A sense resistor $R_S$ 334 is connected between node 326 and the inductor 332 with the other side of the inductor 332 connected to ground. An output network 336 is represented by the capacitor 324, the load resistor $R_L$ 322, the sense resistor $R_S$ 334, and the inductor 332. The output network will be described in more detail below in association with FIG. 4.

The passive LC reconstruction filter 330 acts as a low-pass filter to remove the high-frequency PWM carrier signal and other noise components above the audio frequency band. The passive LC reconstruction filter 330 also reconstructs the audio signal as an amplified audio current-mode signal capable of driving a loudspeaker represented by the load resistor $R_L$ 322.

With the circuit of FIG. 3 defined, operational characteristics may now be described. Gain within the audio baseband (e.g., typically 20 Hz-20 kHz) is defined by the resistor ratio $R_1$ 328/$R_2$ 306. Accordingly, the inverting amplifier operates as an integrator with high gain in the audio baseband with the output signal equal to the input signal multiplied by the ratio of $R_1$ 328/$R_2$ 306 at audio frequencies.

In the audio baseband, the output current $I_{RL}$ 320 that flows through the load resistor $R_L$ 322 equals negative ($-R_1$ 328/$R_2$ 306) multiplied by a quotient of the input voltage $U_e$ and sense resistor $R_S$ 334. Equation (1) below describes this relationship without numerical reference designators for ease of illustration.

$$I_{RL} = -\frac{R_1}{R_2} \cdot \frac{U_e}{R_S} \quad (1)$$

As described above, the components of the passive LC reconstruction filter 330 are split into the separate capacitor 324 across the load resistor $R_L$ 322, and the inductor 332 between the sense resistor $R_S$ 334 and ground.

Figure 4:
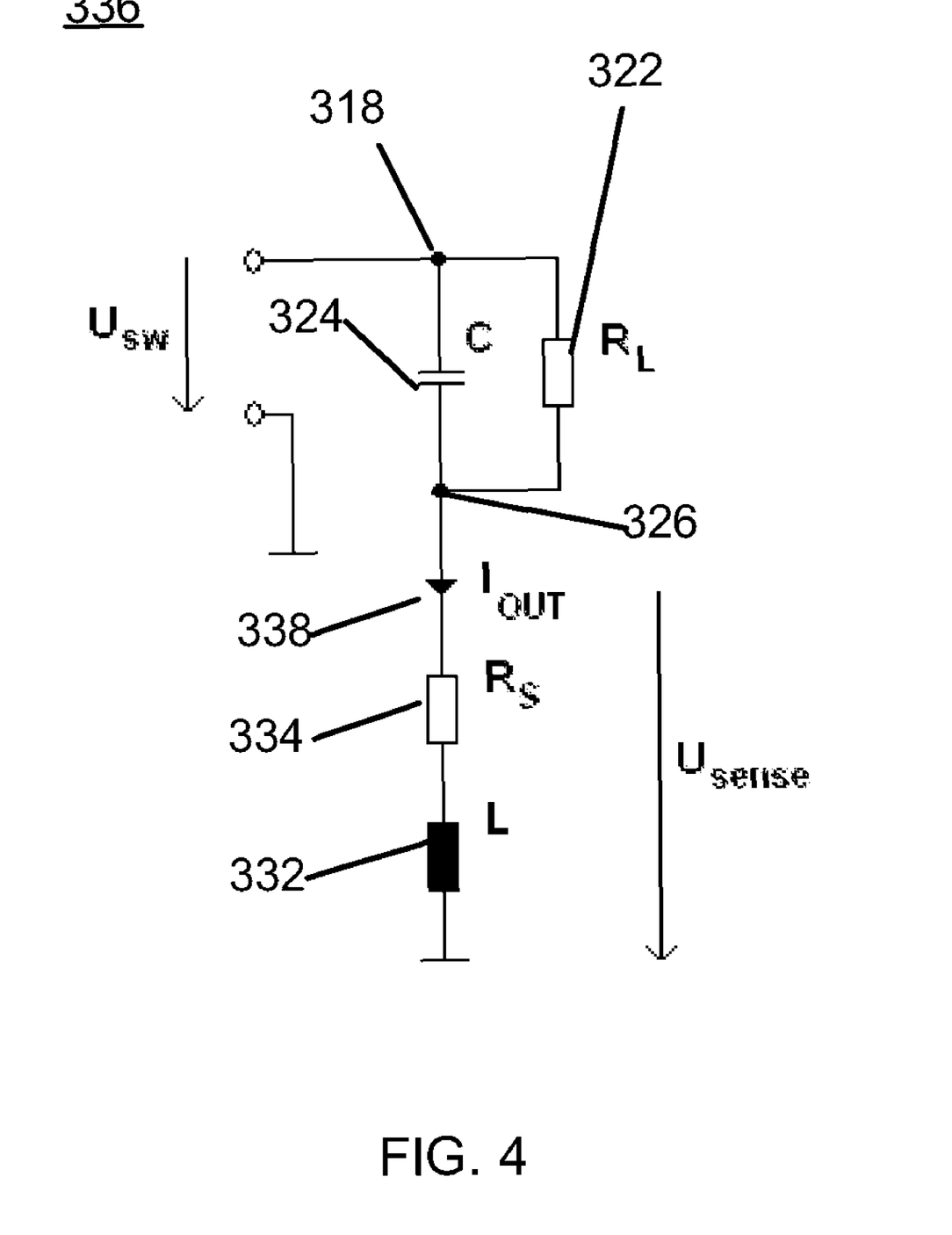
FIG. 4 is a circuit diagram of the output network of FIG. 3.

FIG. 4 is a circuit diagram of the output network 336 of FIG. 3. Within FIG. 4, the output network 336 is redrawn for purposes of illustration and analysis. An output current $I_{OUT}$ 338 is defiled as the output current through the sense resistor $R_S$ 334 and the inductor 332. Linear circuit analysis yields the loop transfer function with the power amplifier output $U_{SW}$ as a network input signal and $U_{SENSE}$ as an output signal. Equation (2) below describes the loop transfer function without numerical reference designators for ease of illustration.

$$\frac{U_{SENSE}}{U_{SW}} = \frac{s^2 R_L LC + s \cdot (L + R_S R_L C) + R_S}{s^2 R_L LC + s \cdot (L + R_S R_L C) + R_S + R_L}, \quad (2)$$
$$s = j2\pi f.$$

Figure 5:
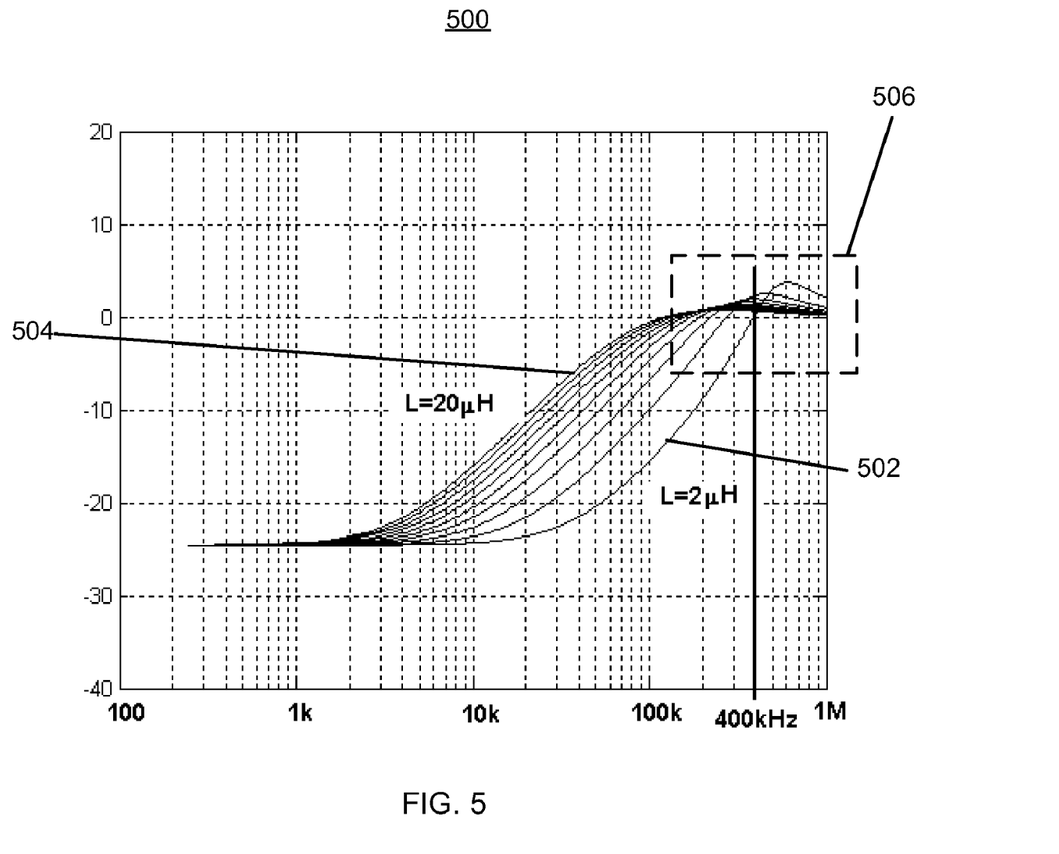
FIG. 5 is a simulation output of a logarithmic magnitude voltage transfer function in accordance with equation (2) in a frequency range of 100 Hz to 1 MHz.

FIG. 5 is a simulation output 500 of the logarithmic magnitude of the voltage transfer function in accordance with equation (2) in a frequency range of 100 Hz to 1 MHz. Component values chosen for simulation were 47 nanofarads for the capacitor 324 (C=47 nF), 8 Ohms for the load resistor $R_L$ 322 ($R_L$=8 Ohms), and 0.5 ohm for sense resistor $R_S$ 334 ($R_S$=0.5 Ohm). Each curve within FIG. 5 represents a different inductance value in multiples of 2 microhenrys (2 μH). For example, curve 502 represents the voltage transfer function of the output network 336 for a value of 2 μH for the inductor 332 and curve 504 represents the output of the output network 336 for a value of 20 μH for the inductor 332. To prevent crowding on the simulation output 500, reference designators have not been placed on all curves within FIG. 5.

As can be seen from FIG. 5 in a region 506, above a certain value of the inductor 332 (e.g., about 6 μH) the transfer function around the carrier frequency (e.g., 300-500 kHz) is approximately one (e.g., zero dB). This means that the high-frequency signal is fed back to the input unattenuated. As such, self-oscillation in the class-D amplifier 212 of FIG. 3 performs similarly to the conventional class-D amplifier 100 of FIG. 1 even though the output passive LC reconstruction filter 330 is now embedded in the feedback loop. Accordingly, the passive LC reconstruction filter 330 has been integrated into the feedback loop while maintaining performance of the self-oscillating nature of the class-D amplifier 212.

Referring again to FIG. 4, the output current $I_{OUT}$ 338 is defined by the following equation (3), again with reference designators removed for ease of illustration. As can be seen from equation (3), the output current $I_{OUT}$ 338 is complex in nature.

$$I_{OUT} = U_{SW} \cdot \frac{sR_L LC + 1}{s^2 R_L LC + s \cdot (L + R_S R_L C) + R_L + R_S} \quad (3)$$

Power dissipation across the sense resistor $R_S$ 334 (e.g., $P_{RS}$) is defined by the following equation (4) as the real portion of the complex result of $R_S$ 334 multiplied by the output current $I_{OUT}$ 338 squared, again with reference designators removed for ease of illustration.

$$P_{RS} = \text{Re}\{R_S I_{OUT}^2\} \quad (4)$$

Figure 6:
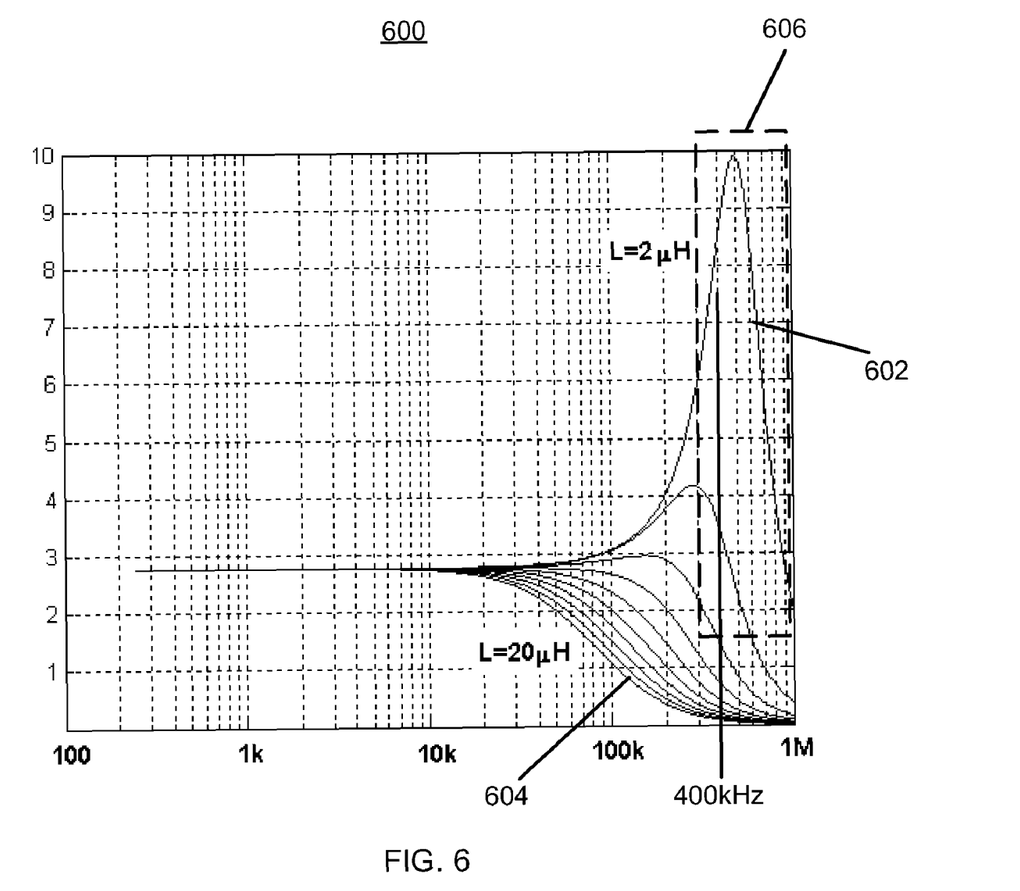
FIG. 6 is a simulation of the power transfer function in Watt across the sense resistor in accordance with equation (4) in a frequency range of 100 Hz to 1 MHz.

FIG. 6 is a simulation 600 of the power transfer function in Watt across the sense resistor in accordance with equation (4) in a frequency range of 100 Hz to 1 MHz. For this simulation, the value of $U_{SW}$ was set to 20 V. Each curve within FIG. 6 represents a different inductance value in multiples of 2 μH. For example, curve 602 represents the filter performance of the output network 336 for a value of 2 μH for the inductor 332 and curve 604 represents the output of the output network 336 for a value of 20 μH for the inductor 332. Again, to prevent crowding on the simulation output 600, reference designators have not been placed on all curves within FIG. 6.

As can be seen from FIG. 6 in a region 606, for lower values of the inductor 332, the carrier frequency is not effectively filtered. Accordingly, inductor values below 6 μH are likely to degrade filter performance and cause excessive heat dissipation with a corresponding loss of efficiency.

Figure 7:
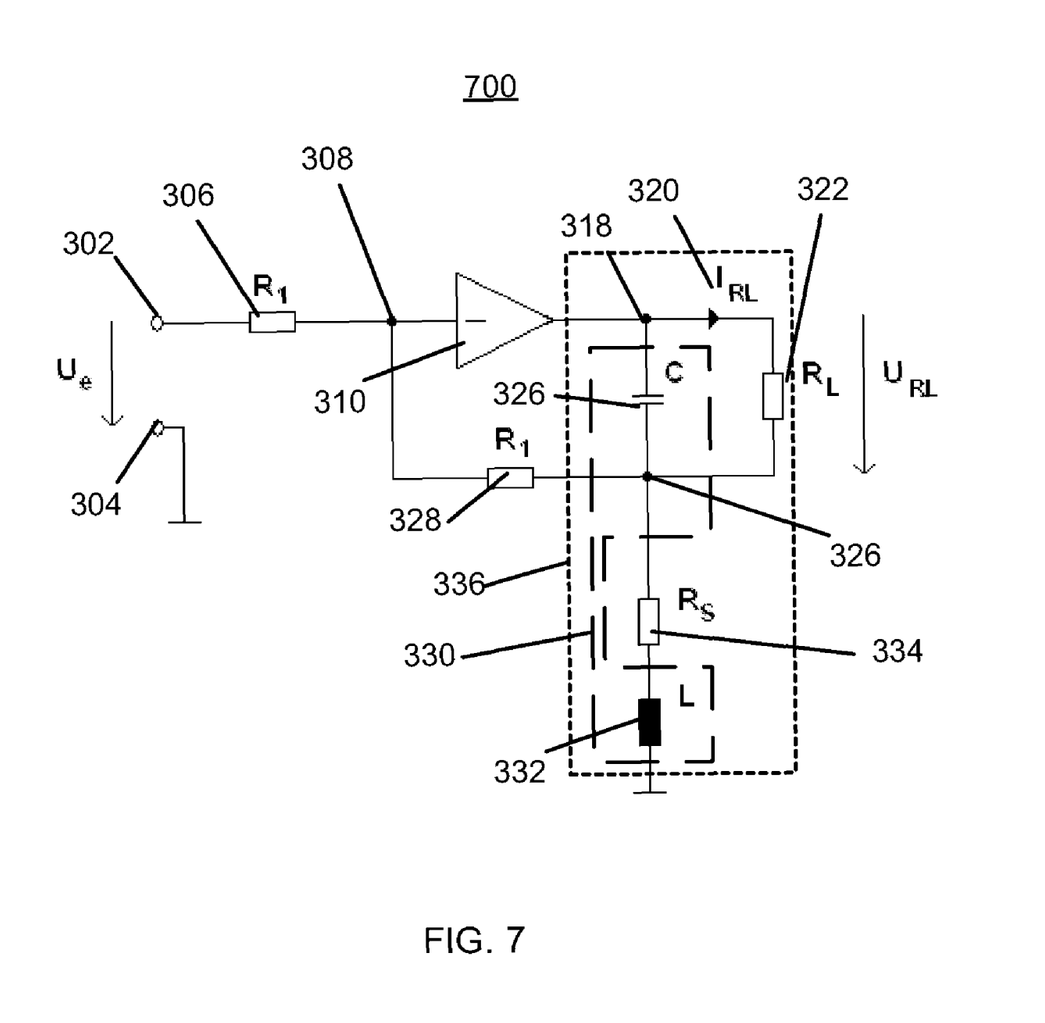
FIG. 7 is a circuit diagram of an example of one implementation of a linearized circuit representation of the class-D amplifier of FIG. 3.

FIG. 7 is a circuit diagram of an example of one implementation of a linearized circuit representation 700 of the class-D amplifier 212 of FIG. 3. With the linearized circuit representation 700, a computation of the voltage transfer function into a resistive load is possible. By setting the gain to unity (e.g., setting $R_1$ 328 and $R_2$ 306 to equal values), equation (5) for the voltage transfer function of the linearized circuit representation 700 is obtained.

$$\frac{U_{RL}}{U_e} = \frac{-1}{s^2 LC + s \cdot \left(R_S C + \frac{L}{R_L}\right) + \frac{R_S}{R_L}} \quad (5)$$

Figure 8:
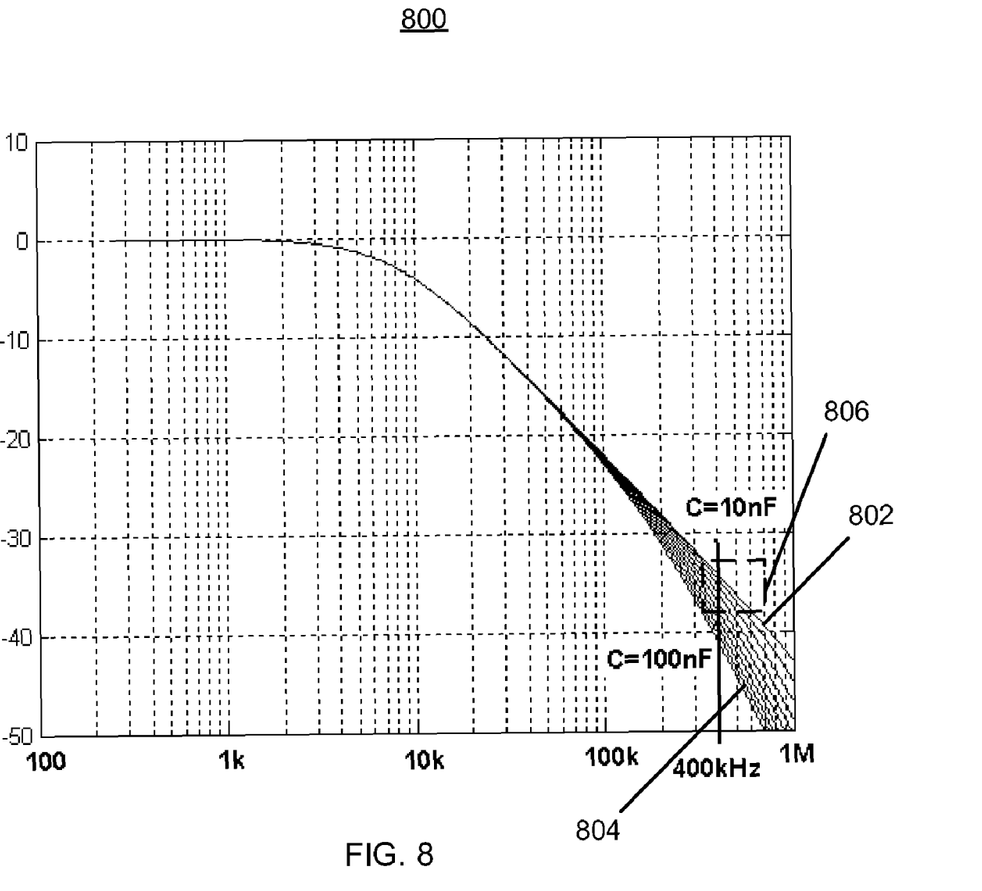
FIG. 8 is a simulation output of a logarithmic magnitude voltage transfer function in accordance with equation (5) in a frequency range of 100 Hz to 1 MHz for variations in the value of capacitance for the capacitor of the class-D transconductance amplifier of FIG. 7.

FIG. 8 is a simulation output 800 of a logarithmic magnitude of the voltage transfer function in accordance with equation (5) in a frequency range of 100 Hz to 1 MHz for variations in the value of capacitance for the capacitor 326 of the class-D transconductance amplifier 212 of FIG. 7. For this simulation, the value of the inductor 332 was set to 10 μH. Each curve within FIG. 8 represents a different capacitance value for the capacitor 326 in multiples of 10 nF ranging from 10 nF to 100 nF. For example, curve 802 represents the output of the transfer function of equation (5) for a value of 10 nF for the capacitor 326 and curve 804 represents the output of the transfer function of equation (5) for a value of 100 nF for the capacitor 326. Again, to prevent crowding on the simulation output 800, reference designators have not been placed on all curves within FIG. 8.

As can be seen from FIG. 8 in a region 806, stopband suppression may be varied by changing the value of the capacitor 326. As such, by selecting a value for the capacitor 326 of approximately 50 nF or more, a carrier suppression of more than 40 decibels (dB) at 400 kHz may be achieved. In general, the voltage transfer function is approximately flat in the audio band (e.g., 20 Hz-20 kHz) and provides a sufficient stop-band attenuation at high frequencies in order to suppress the carrier frequency (e.g., 300-500 kHz).

Figure 9:
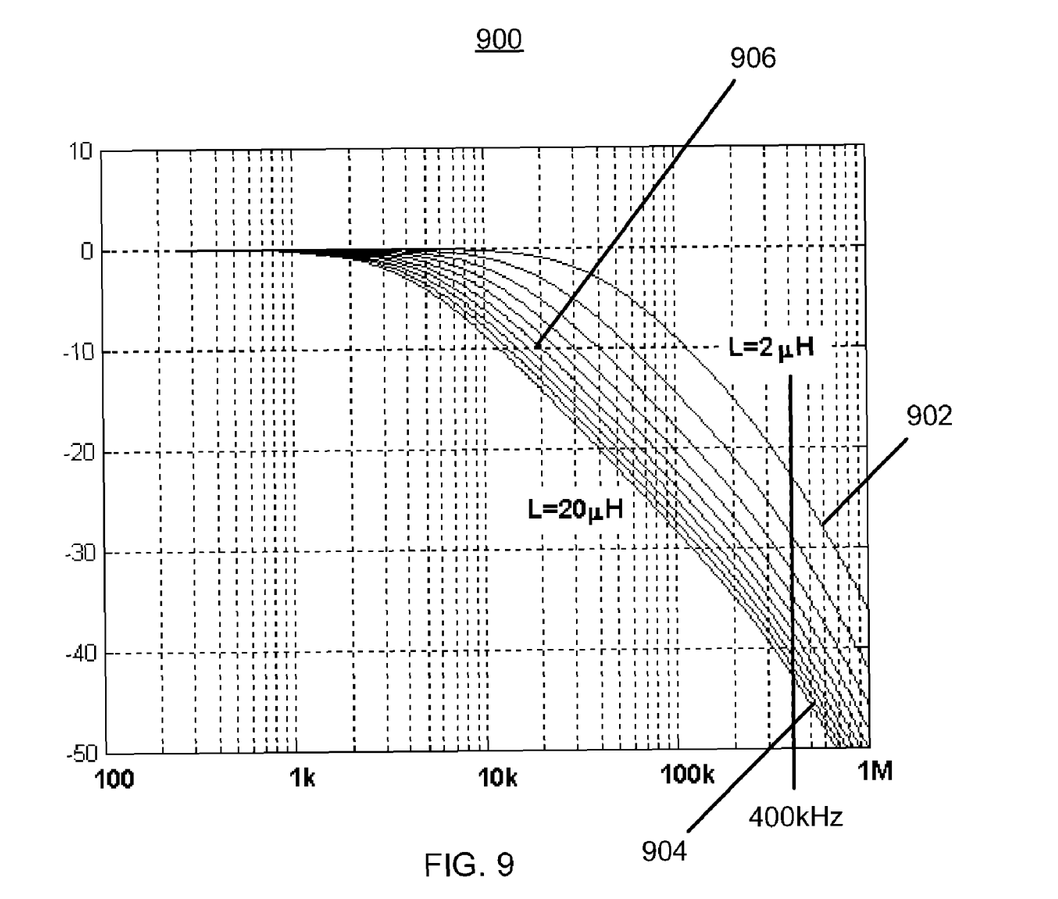
FIG. 9 is a simulation output of a logarithmic magnitude voltage transfer function in accordance with equation (5) in a frequency range of 100 Hz to 1 MHz for variations in the value of inductance for the inductor of the class-D transconductance amplifier of FIG. 7.

FIG. 9 is a simulation output 900 of a logarithmic magnitude of the voltage transfer function in accordance with equation (5) in a frequency range of 100 Hz to 1 MHz for variations in the value of inductance for the inductor 332 of the class-D transconductance amplifier of FIG. 7. For this simulation, the value of the inductor was varied between 2 μH and 20 μH. Each curve within FIG. 9 represents a different inductance value for the inductor 332. For example, curve 902 represents the output of the transfer function of equation (5) for a value of 2 μH for the inductor 332 and curve 904 represents the output of the transfer function of equation (5) for a value of 20 μH for the inductor 332. Again, to prevent crowding on the simulation output 900, reference designators have not been placed on all curves within FIG. 9.

As can be seen from FIG. 9 in a location 906, attenuation of 10 dB occurs at 20 kHz. As such, by selecting a lower value for the inductor 332, frequency response may be improved. The attenuation exhibited in the simulation output 900 may be equalized prior to amplification by a separate filter (not shown).

Figure 10:
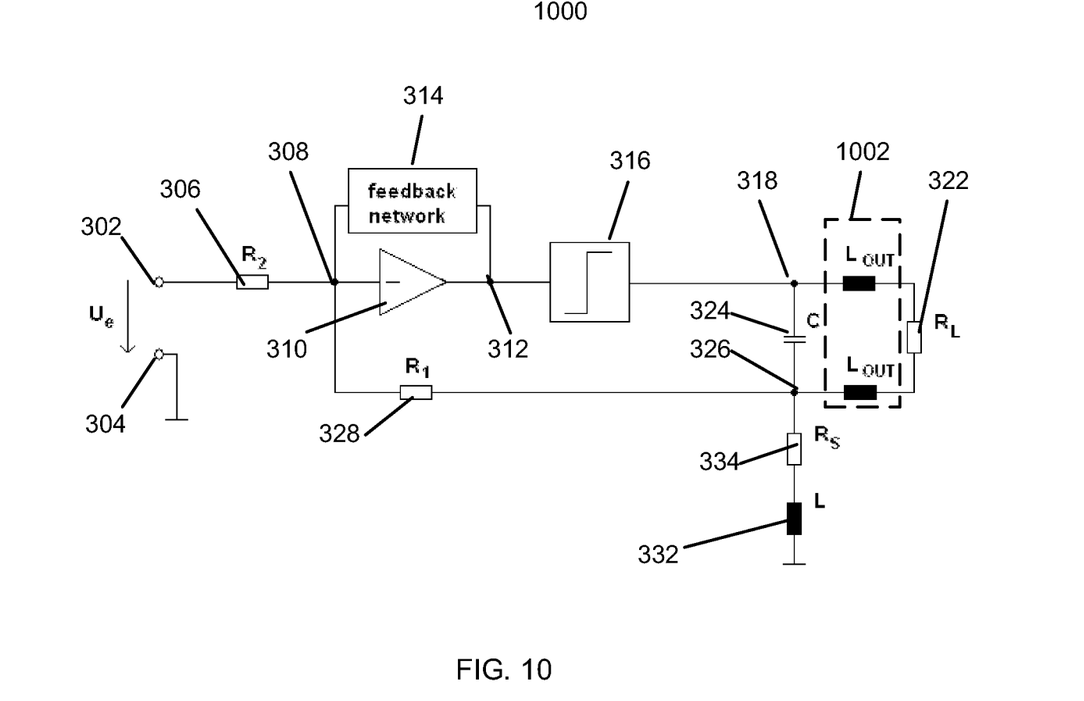
FIG. 10 is circuit diagram of another example of one implementation of a class-D transconductance amplifier.

FIG. 10 is circuit diagram of an alternative example of an implementation of a class-D transconductance amplifier 1000. FIG. 10 introduces a pair of inductors $L_{OUT}$ 1002. The pair of inductors $L_{OUT}$ 1002 decouple the amplifier output from the load $R_L$ 322 at higher frequencies. The impedance of the load $R_L$ 322 may cause deviations from an ideal switching waveform, inducing noise and increased distortion. Additionally, cables may act as antennas under certain circumstances.

Accordingly, use of the pair of inductors $L_{OUT}$ 1002 may decrease loading of the power switch 316 with impedance of a cable that connects to the load $R_L$ 322. Reducing the induced noise and distortion may also help to reduce high-frequency radiation over the cable, such as electromagnetic interference (e.g., EMI).

Figure 11:
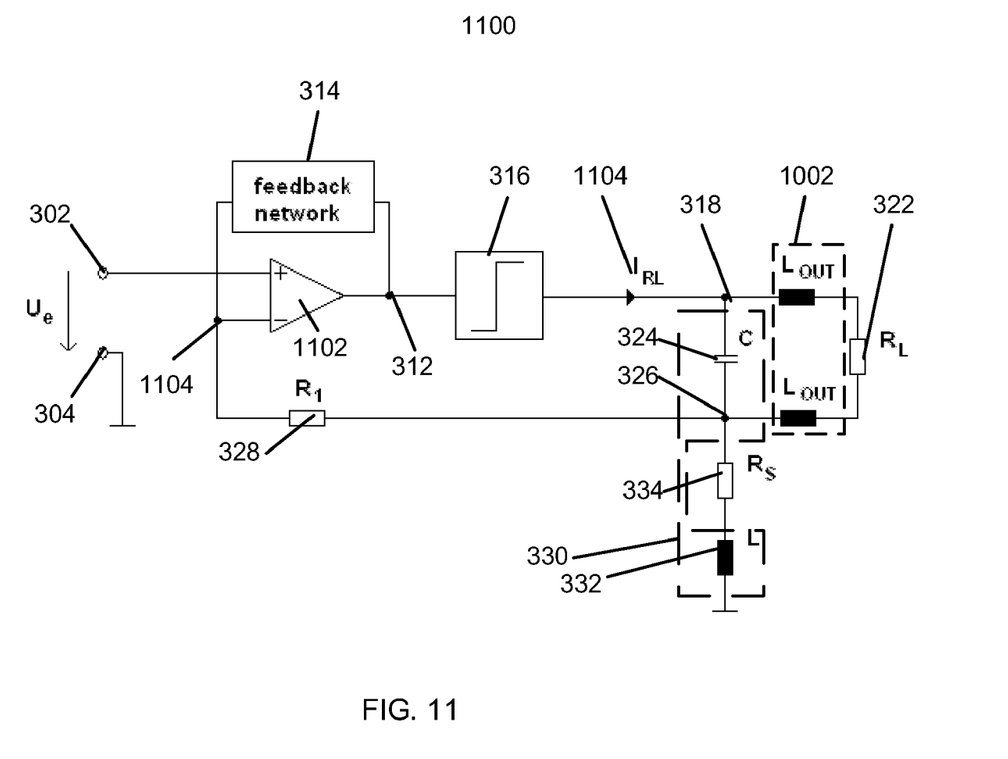
FIG. 11 is a circuit diagram of another example of one implementation of a non-inverting transconductance class-D amplifier.

FIG. 11 is a circuit diagram of yet another alternative example of an implementation of a non-inverting class-D transconductance amplifier 1100. A non-inverting amplifier 1102 receives the audio input signal directly from input terminal 302 at its positive input and amplifies the input signal to create an output signal at its output to node 312. Feedback from the feedback network 314 arrives at a node 1104 along with feedback returning via resistor $R_1$ 328, and both are fed to the negative input of the non-inverting amplifier 1102.

It should be noted that the input resistor $R_2$ 306 is not present, but that the passive LC reconstruction filter 330 still forms a portion of the feedback circuitry within the non-inverting class-D amplifier 1100. Equation (6) below describes the current through the load resistor $R_L$ 322 in the audio baseband, again without numerical reference designators for ease of illustration.

$$I_{RL} = \frac{U_e}{R_S} \qquad (6)$$

Figure 12:
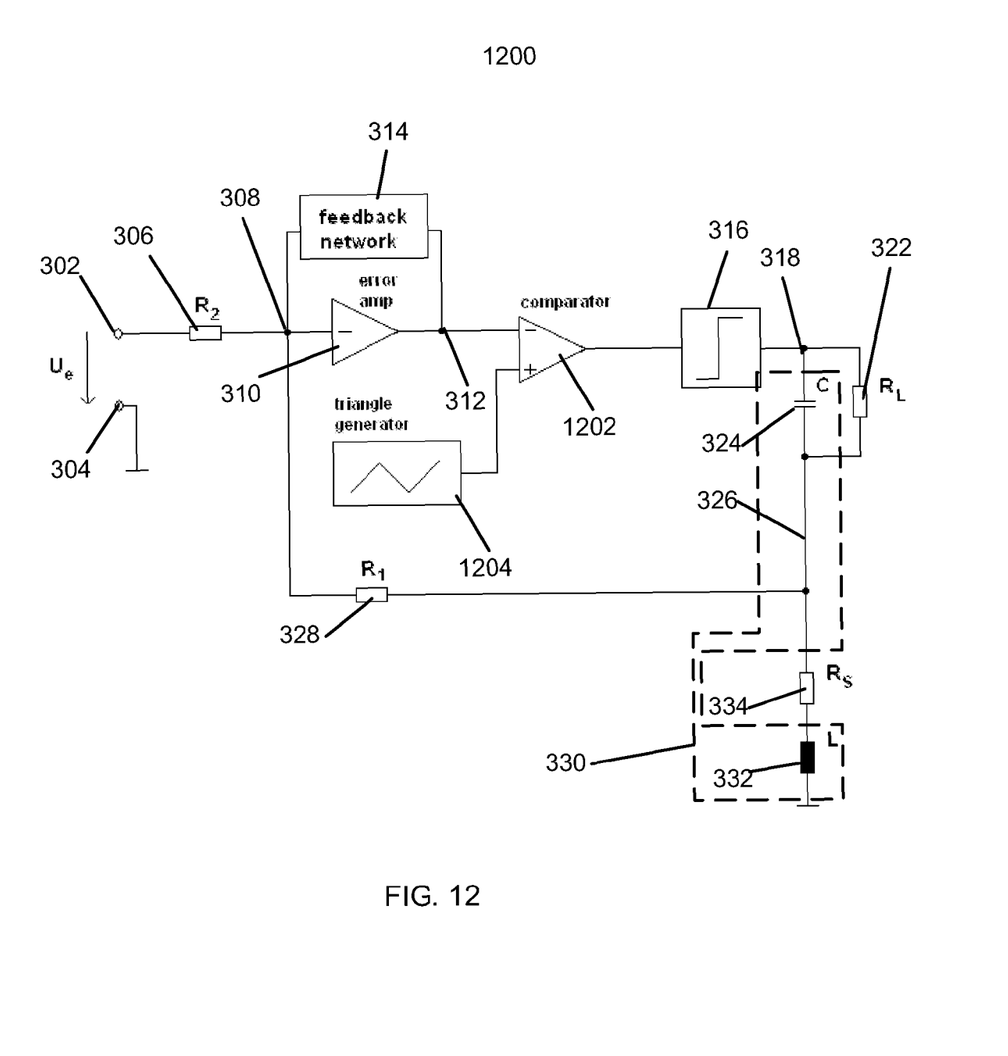
FIG. 12 is a circuit diagram of yet another example of an implementation of a natural pulse width modulation (PWM) transconductance class-D amplifier.

FIG. 12 is a circuit diagram of yet another example of an alternative natural pulse width modulation (PWM) class-D transconductance amplifier 1200. The term "natural" refers to the non-self oscillating nature of the amplifier 1200. The audio signal is processed within the amplifier 1200 using the same high gain error amplifier 310 as in the self-oscillating examples described above. To induce oscillation, a comparator 1202 compares the audio signal presented by the high gain error amplifier 310 at node 312 with a triangular-shaped signal provided by a triangular waveform generator 1204. The result of the comparison operation produces a PWM signal that is fed to the output stage at the power switch 316. As with the previous examples, the passive LC reconstruction filter 330 forms an integral portion of the feedback for the high gain error amplifier 310.

A class-D transconductance amplifier that operates in a current feedback mode as a voltage-controlled current source has been described. The current source operation of the class-D transconductance amplifier provides stable current-mode operation relative to voltage-controlled voltage source operation of conventional class-D amplifiers. Additionally, a passive LC reconstruction filter has been integrated into a feedback loop within the amplifier without phase delays and noise that would be associated with conventional passive LC reconstruction filters.

While various embodiments of the invention have been described, it will be apparent to those of ordinary skill in the art that many more embodiments and implementations are possible within the scope of this invention. Accordingly, the invention is not to be restricted except in light of the attached claims and their equivalents.

What is claimed is:

1. A circuit for driving an audio loudspeaker, comprising:
   an amplifier;
   an input resistor connected between an audio source and an input of the amplifier;
   a feedback network connected between an output of the amplifier and an input of the amplifier;
   a capacitor connected at a first terminal to a first terminal of the audio loudspeaker and a at a second terminal to a second terminal of the audio loudspeaker;
   a power switch adapted to provide drive current to the audio loudspeaker and connected between the output of the amplifier and the first terminal of the capacitor;
   a feedback resistor connected between the second terminal of the capacitor and the input of the amplifier;
   a sense resistor connected at a first terminal to the second terminal of the capacitor; and
   an inductor connected between a second terminal of the sense resistor and ground,
   where the capacitor (C) and the inductor (L) form a passive LC reconstruction filter having at least a portion of the passive LC reconstruction filter situated in a feedback loop of the amplifier and the circuit is adapted to operate in a current feedback mode as a voltage-controlled current source.

2. The circuit of claim 1 where the amplifier further comprises an operational amplifier.

3. The circuit of claim 2 further comprising:
   a triangular waveform generator adapted to generate a triangular waveform; and
   a comparator adapted to compare an output of the operational amplifier with the triangular waveform and drive the power switch based upon the comparison.

4. The circuit of claim 1 where the portion of the passive LC reconstruction filter situated in the feedback loop of the amplifier includes the capacitor and the capacitor is further adapted to provide feedback of an output signal at the audio loudspeaker to the input of the amplifier without phase lag.

5. The circuit of claim 1 further comprising a pair of inductors adapted to decouple the circuit from the audio loudspeaker, where a first inductor of the pair of inductors is connected between the first terminal of the capacitor and the first terminal of the audio loudspeaker and a second inductor of the pair of inductors is connected between the second terminal of the capacitor and the second terminal of the audio loudspeaker.

6. A circuit for driving an audio loudspeaker, comprising:
   a non-inverting amplifier adapted to receive an audio signal from an audio source at a positive input terminal;
   a feedback network connected between an output of the non-inverting amplifier and a negative input of the non-inverting amplifier;
   a capacitor connected at a first terminal to a first terminal of the audio loudspeaker and a at a second terminal to a second terminal of the audio loudspeaker;
   a power switch adapted to provide drive current to the audio loudspeaker and connected between the output of the non-inverting amplifier and the first terminal of the capacitor;
   a feedback resistor connected between the second terminal of the capacitor and the negative input of the non-inverting, amplifier;
   a sense resistor connected at a first terminal to the second terminal of the capacitor; and
   an inductor connected between a second terminal of the sense resistor and ground,
   where the capacitor (C) and the inductor (L) form a passive LC reconstruction filter having at least a portion of the passive LC reconstruction filter situated in a feedback loop of the amplifier and the circuit is adapted to operate in a current feedback mode as a voltage-controlled current source.

7. The circuit of claim 6 where the portion of the passive LC reconstruction filter situated in the feedback loop of the amplifier includes the capacitor and the capacitor is further adapted to provide feedback of an output signal at the audio loudspeaker to the input of the amplifier without phase lag.

8. The circuit of claim 6 further comprising a pair of inductors adapted to decouple the circuit from the audio loudspeaker, where a first inductor of the pair of inductors is connected between the first terminal of the capacitor and the first terminal of the audio loudspeaker and a second inductor of the pair of inductors is connected between the second terminal of the capacitor and the second terminal of the audio loudspeaker.

9. A method for driving an audio loudspeaker, comprising:
operating a class-D audio amplifier in a current feedback mode as a voltage-controlled current source;
decoupling the audio loudspeaker from the class-D amplifier using a pair of inductors, with a first inductor of the pair of inductors connected in series between a first terminal of a capacitor and a first terminal of the audio loudspeaker and second inductor of the pair of inductors connected in series between a second terminal of the capacitor and a second terminal of the audio loudspeaker;
reconstructing an audio signal at the audio loudspeaker using a passive class-D reconstruction filter, where at least a portion of the passive class-D reconstruction filter is located within a feedback loop to an input of the class-D audio amplifier; and
driving the audio loudspeaker with the reconstructed audio signal.

10. The method of claim 9, where the passive class-D reconstruction filter further comprising:
connecting the capacitor across terminals of the audio loudspeaker; and
providing feedback to the input of the class-D audio amplifier via a connection to a terminal of the capacitor.

11. The method of claim 9 where the class-D audio amplifier includes an error amplifier, and providing the feedback to the input of the class-D audio amplifier further comprises providing the feedback to an input of the error amplifier.

12. The method of claim 9 where the class-D audio amplifier includes a non-inverting amplifier, and providing the feedback to the input of the class-D audio amplifier further comprises providing the feedback to an input of the non-inverting amplifier.

13. The method of claim 9 where providing the feedback to the input of the non-inverting amplifier further comprises providing the feedback to a negative input of the non-inverting amplifier.

14. The method of claim 9 where the class-D audio amplifier includes a triangular waveform generator, an error amplifier, and a comparator, and providing the feedback to the input of the class-D audio amplifier includes providing the feedback to an input of the error amplifier, and further comprising:
generating a triangular waveform using the triangular waveform generator;
comparing an output of the error amplifier with the triangular waveform using the comparator; and
driving a power switch with an output of the comparator.

15. A class-D audio amplifier, comprising:
a power switch adapted to provide drive current to an audio loudspeaker;
a passive inductor/capacitor (LC) reconstruction filter adapted to situate at least a portion of the passive LC reconstruction filter in a feedback loop to an error amplifier;
where the class-D audio amplifier operates in a current feedback mode as a voltage-controlled current source; and
a pair of inductors adapted to decouple the power switch and the passive LC reconstruction filter from the audio loudspeaker.

16. The class-D audio amplifier of claim 15 where the passive LC reconstruction filter further comprises a capacitor and an inductor and, in being adapted to situate at least a portion of the passive LC reconstruction filter in the feedback loop, the passive LC reconstruction filter is further adapted to situate the capacitor in the feedback loop.

17. The class-D audio amplifier of claim 15 where the capacitor is further adapted to provide feedback of an output signal at the audio loudspeaker to an input of the error amplifier without phase lag.

* * * * *